United States Patent
Hodota (10) Patent No.: US 9,373,764 B2
(45) Date of Patent: Jun. 21, 2016

(54) SEMICONDUCTOR LIGHT EMITTING ELEMENT

(71) Applicant: TOYODA GOSEI CO., LTD., Kiyosu-shi, Aichi-ken (JP)

(72) Inventor: Takashi Hodota, Ichihara (JP)

(73) Assignee: TOYODA GOSEI CO., LTD., Aichi (JP)

(*) Notice: Subject to any disclaimer, the term of this patent is extended or adjusted under 35 U.S.C. 154(b) by 0 days.

(21) Appl. No.: 14/109,822

(22) Filed: Dec. 17, 2013

(65) Prior Publication Data

US 2014/0175489 A1  Jun. 26, 2014

(30) Foreign Application Priority Data

Dec. 26, 2012  (JP) .................................. 2012-282557

(51) Int. Cl.
| | |
|---|---|
| *H01L 33/36* | (2010.01) |
| *H01L 33/60* | (2010.01) |
| *H01L 33/38* | (2010.01) |
| *H01L 33/40* | (2010.01) |

(52) U.S. Cl.
CPC ............... *H01L 33/60* (2013.01); *H01L 33/38* (2013.01); *H01L 33/405* (2013.01)

(58) Field of Classification Search
CPC ....... H01L 33/36; H01L 33/38; H01L 33/387; H01L 33/42; H01L 33/405
USPC .................... 257/88, 93, 94, 98, 99, E33.012, 257/E33.065, E33.072, E33.064, E33.067, 257/E51.021, E33.069
See application file for complete search history.

(56) References Cited

U.S. PATENT DOCUMENTS

| | | | | |
|---|---|---|---|---|
| 6,281,524 | B1* | 8/2001 | Yamamoto et al. | 257/99 |
| 8,247,823 | B2* | 8/2012 | Yahata et al. | 257/79 |
| 8,258,519 | B2* | 9/2012 | Hsu | 257/79 |
| 8,637,888 | B2* | 1/2014 | Hodota et al. | 257/98 |
| 2005/0253156 | A1* | 11/2005 | Horio et al. | 257/94 |
| 2007/0138490 | A1* | 6/2007 | Nagai et al. | 257/94 |
| 2007/0210320 | A1 | 9/2007 | Ikemoto et al. | |
| 2007/0241348 | A1* | 10/2007 | Inoue et al. | 257/88 |
| 2008/0001526 | A1* | 1/2008 | Murakami | 313/500 |
| 2009/0020769 | A1* | 1/2009 | Yoneda et al. | 257/88 |
| 2009/0039359 | A1* | 2/2009 | Yoon et al. | 257/88 |

(Continued)

FOREIGN PATENT DOCUMENTS

| | | |
|---|---|---|
| CN | 101030614 A | 9/2007 |
| JP | 2009-164423 A | 7/2009 |
| JP | 2010-263016 A | 11/2010 |
| JP | 2011-071339 A | 4/2011 |
| WO | 2009/057241 A1 | 5/2009 |
| WO | 2009/057311 A1 | 5/2009 |

*Primary Examiner* — Latanya N Crawford
(74) *Attorney, Agent, or Firm* — Sughrue Mion, PLLC (57) ABSTRACT

A semiconductor light emitting element includes: a laminated semiconductor layer in which an n-type semiconductor layer, a light emitting layer and a p-type semiconductor layer are laminated; plural n-side electrodes that are laminated on the n-type semiconductor layer, electrically connected to the n-type semiconductor layer and arranged to surround at least a partial region of the light emitting layer and the p-type semiconductor layer as viewed from a lamination direction; and a p-side electrode that is provided on the p-type semiconductor layer, provided with a reflective property to light outputted from the light emitting layer and electrically connected to the p-type semiconductor layer, the p-side electrode including a connecting portion, which is used for electrical connection with an outside, at a region surrounded by the plural n-side electrodes as viewed from the lamination direction.

2 Claims, 9 Drawing Sheets

(56) References Cited

U.S. PATENT DOCUMENTS

| | | |
|---|---|---|
| 2010/0012968 A1* | 1/2010 | Yahata et al. .................... 257/99 |
| 2010/0258837 A1 | 10/2010 | Hori et al. |
| 2011/0018024 A1* | 1/2011 | Fukshima et al. ............... 257/98 |
| 2011/0233586 A1* | 9/2011 | Kojima et al. ................... 257/98 |
| 2012/0012889 A1 | 1/2012 | Okabe et al. |
| 2012/0049219 A1* | 3/2012 | Kamiya et al. .................. 257/98 |
| 2013/0105845 A1* | 5/2013 | Kim et al. ........................ 257/98 |
| 2014/0001502 A1* | 1/2014 | Akimoto et al. ................. 257/98 |
| 2014/0151735 A1* | 6/2014 | Donofrio et al. ................ 257/98 |

* cited by examiner

N-SIDE ELECTRODE

FIG.7B

N-SIDE ELECTRODE

FIG.7C

N-SIDE ELECTRODE

FIG.7D

N-SIDE ELECTRODE

FIG.7E

N-SIDE ELECTRODE

FIG.7F

N-SIDE ELECTRODE

FIG.7G

N-SIDE ELECTRODE

| N-ELECTRODE | Vf20mA | Vf80mA | Vf120mA | Vf160mA | Vf240mA |
|---|---|---|---|---|---|
| N-DISTRIBUTION | 2.80 | 2.94 | 3.00 | 3.05 | 3.14 |
| REFERENCE EXAMPLE | 2.82 | 3.04 | 3.14 | 3.23 | 3.40 |

SEMICONDUCTOR LIGHT EMITTING ELEMENT

CROSS REFERENCE TO RELATED APPLICATIONS

This application is based on and claims priority under 35 USC §119 from Japanese Patent Application No. 2012-282557 filed Dec. 26, 2012, incorporated herein by reference in its entirety.

BACKGROUND

1. Technical Field

The present invention relates to a semiconductor light emitting element.

2. Related Art

In recent years, a flip-chip bonding (FC) mounting technology, in which a growth substrate side opposite to an electrode formation surface is provided as a main light extraction surface, has been developed. For example, in Japanese Patent Application Laid-Open Publication No. 2010-263016, there is described a semiconductor light emitting element that includes a substrate composed of sapphire, a laminated semiconductor layer including an n-type semiconductor layer, a light emitting layer and a p-type semiconductor layer and laminated on the substrate, a positive electrode formed on the p-type semiconductor layer and a negative electrode formed on the n-type semiconductor layer, and is mounted by flip-chip bonding.

Incidentally, in the semiconductor light emitting element, when a voltage in which the p-side electrode formed on the p-type semiconductor layer is at the high potential and the n-side electrode formed on the n-type semiconductor layer is at the low potential (a forward voltage VF) is applied, a current (a forward current IF) heading toward the n-side electrode from the p-side electrode through the p-type semiconductor layer, the light emitting layer and the n-type semiconductor layer is passed, and thereby light of the target light emission wavelength is outputted from the light emitting layer. Then, in the semiconductor light emitting element mounted by FC, the light outputted on the electrode formation surface side from the light emitting layer is reflected by a reflecting surface provided on the electrode formation surface side, to be thereby extracted from the growth substrate side opposite to the electrode formation surface.

In the semiconductor light emitting element mounted by FC, it is preferable that the entire surface of the chip uniformly emits light with the light extracted in the direction of the growth substrate side. However, there are some cases in which light emission becomes non-uniform due to the number of electrodes formed on the electrode formation surface side or arrangement thereof. For example, if the n-side electrode is provided at the center portion of the chip and the p-side electrode is provided at each of four corners of the chip, there occurs a problem that light emission is concentrated at the center portion of the chip, and thereby light emission efficiency is lowered, and further, another problem that the chip is apt to be damaged in the electro-static-discharge (ESD) inspection, which is different from uniformity or efficiency of light emission, arises.

It is an object of the present invention to solve a problem that light emission is concentrated at the center portion of the chip, and accordingly the light emission efficiency is lowered, and a problem of ESD damage withstanding voltage in the FC (flip-chip) mounting technology of the semiconductor light emitting element.

SUMMARY

According to an aspect of the present invention, there is provided a semiconductor light emitting element including: a laminated semiconductor layer in which an n-type semiconductor layer, a light emitting layer and a p-type semiconductor layer are laminated; plural n-side electrodes that are laminated on the n-type semiconductor layer, electrically connected to the n-type semiconductor layer and arranged to surround at least a partial region of the light emitting layer and the p-type semiconductor layer as viewed from a lamination direction; and a p-side electrode that is provided on the p-type semiconductor layer, provided with a reflective property to light outputted from the light emitting layer and is electrically connected to the p-type semiconductor layer, the p-side electrode including a connecting portion, which is used for electrical connection with an outside, at a region surrounded by the plural n-side electrodes as viewed from the lamination direction.

In the present invention, it is preferable that the p-side electrode includes an insulating reflection layer that is laminated on the p-type semiconductor layer and provided with plural opening portions from which part of the p-type semiconductor layer is exposed.

It is preferable that the p-side electrode includes a transparent conductive layer having transparency to the light outputted from the light emitting layer, and part of the transparent conductive layer is exposed from the opening portions of the insulating reflection layer.

It is preferable that the p-side electrode includes a metal reflection layer that is formed on the insulating reflection layer and in the plural opening portions of the insulating reflection layer.

It is preferable that the insulating reflection layer is a multilayer insulating layer configured by alternately laminating a first insulating layer having a first refractive index and showing optical transparency to the light outputted from the light emitting layer and a second insulating layer having a second refractive index that is higher than the first refractive index and showing optical transparency to the light outputted from the light emitting layer.

According to the present invention, in the FC (flip-chip) mounting technology of the semiconductor light emitting element, the problem that light emission is concentrated at the center portion of the chip, and accordingly the light emission efficiency is lowered, and the problem of the ESD damage withstanding voltage are solved.

BRIEF DESCRIPTION OF THE DRAWINGS

Exemplary embodiments of the present invention will be described in detail based on the following figures, wherein.

DETAILED DESCRIPTION

Hereinafter, exemplary embodiments according to the present invention will be described in detail. It should be noted that the present invention is not limited to the following exemplary embodiments, but may be practiced as various modifications within the scope of the gist of the invention. In other words, unless otherwise specified, dimensions, materials, shapes or relative arrangement of components described in the examples of the exemplary embodiments do not purport to limit the scope of the present invention, but are merely descriptive examples. Further, each of the figures to be used indicates an example for illustration of each exemplary embodiment, and does not represent an actual size thereof. There may be some cases where the size, positional relationship and the like of the parts shown in the figures are exaggerated for clear explanation. Moreover, in this specification, a phrase such as "the layer A formed above (over) the layer B" not only means the case where the layer A is formed above (over) the layer B with a separation therebetween, but also includes the case where the layer A is formed above (over) the layer B with some layer being interposed therebetween.

<Semiconductor Light Emitting Element>

Figure 1:
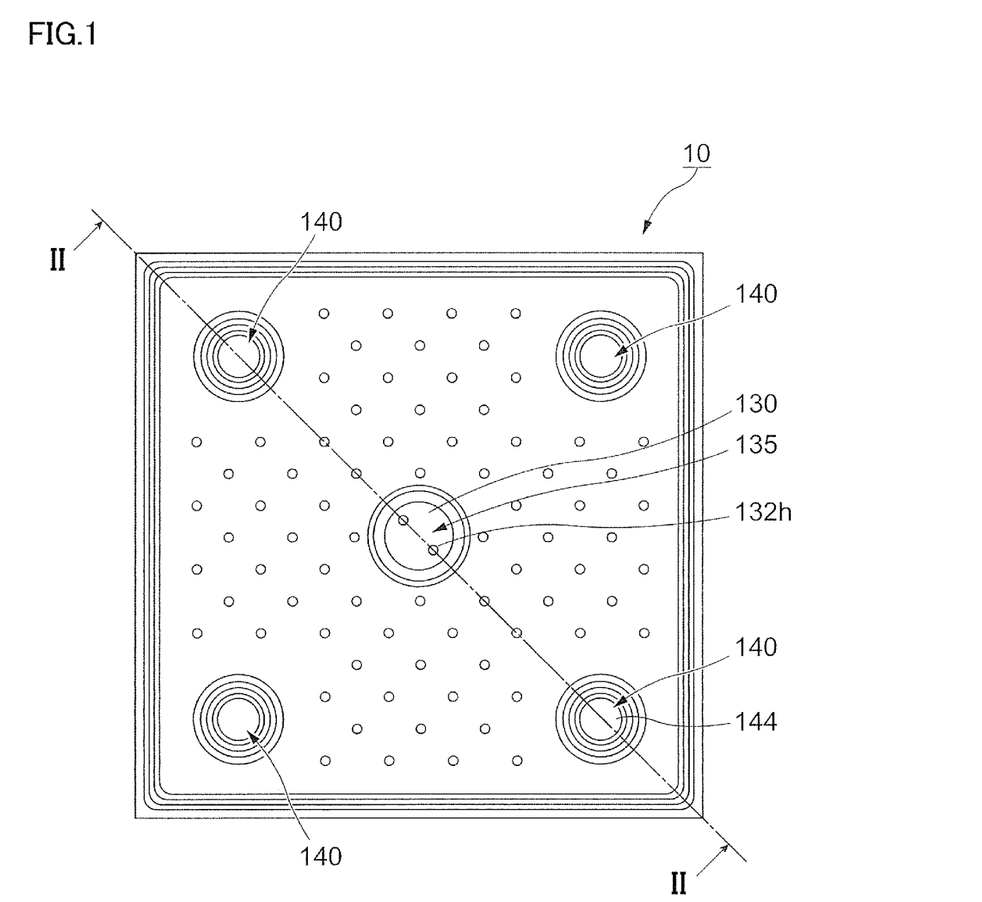
FIG. 1 is a schematic plan view illustrating an example of a semiconductor light emitting element.
Figure 2:
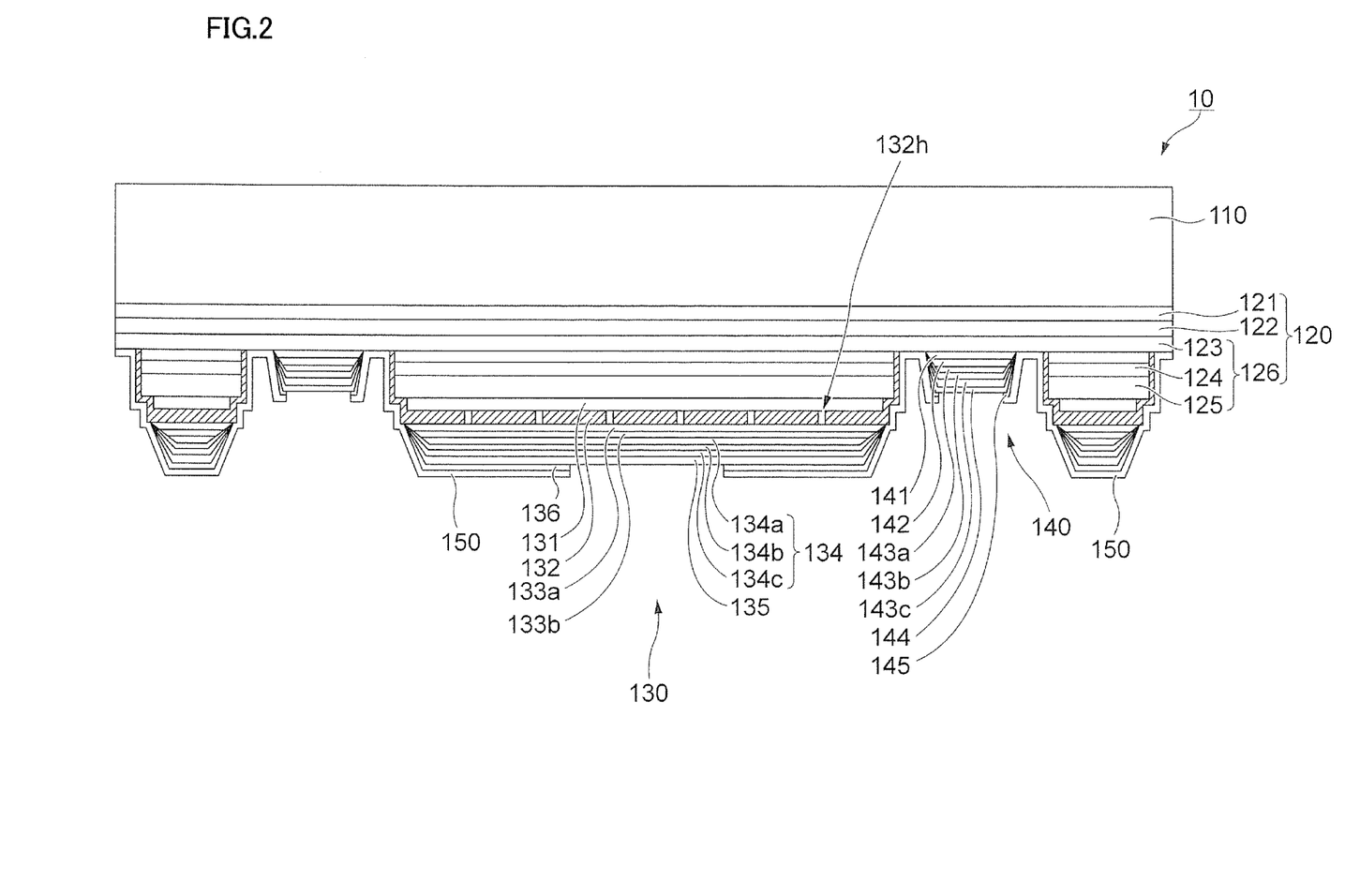
FIG. 2 is an II-II schematic cross-sectional view of the semiconductor light emitting element shown in FIG. 1.

FIG. 1 is a schematic plan view illustrating an example of a semiconductor light emitting element. FIG. 2 is an II-II schematic cross-sectional view of the semiconductor light emitting element shown in FIG. 1. Here, as a state to be flip-chip mounted, an electrode formation surface side of a semiconductor light emitting element 10 is rendered in a lower portion of the figure, and a substrate 110 is rendered in an upper portion of the figure. It should be noted that, in the following description, expression such as "on (above or over) the layer" means that each layer is laminated downwardly in the figure.

Hereinafter, description will be given based on FIGS. 1 and 2.

As shown in FIG. 2, the semiconductor light emitting element 10 includes: the substrate 110; a semiconductor layer 120 laminated on the substrate 110; a p-electrode layer 130 as a p-side electrode, which is a positive electrode formed on the semiconductor layer 120; and n-electrode layers 140 as n-side electrodes, which is negative electrodes.

The semiconductor layer 120 includes an intermediate layer (a buffer layer) 121 deposited on the substrate 110 and a base layer 122 laminated on the intermediate layer 121. Moreover, the semiconductor layer 120 includes a laminated semiconductor layer 126 laminated on the base layer 122. The laminated semiconductor layer 126 is configured with an n-type semiconductor layer 123, a light emitting layer 124 and a p-type semiconductor layer 125 from the base layer 122 side.

The p-electrode layer 130 is formed on a top surface of the p-type semiconductor layer 125. The n-electrode layer 140 is formed on an exposure surface in which part of the n-type semiconductor layer 123 is exposed. Moreover, each of the p-electrode layer 130 and the n-electrode layer 140 includes a portion that exposes a surface thereof positioned at the lower portion in FIG. 2 for electrical connection with the outside through, for example, a plated bump (not shown) or the like.

It should be noted that, in the exemplary embodiment, each of the surfaces of the n-electrode layer 140 and the p-electrode layer 130 is covered with a protecting layer 150 except for a part. The protecting layer 150 is formed to cover part of side wall surfaces of the p-type semiconductor layer 125, the light emitting layer 124 and the n-type semiconductor layer 123.

As shown in FIG. 1, the semiconductor light emitting element 10 has substantially a square planar shape, and in the exemplary embodiment, the n-electrode layers 140, which are the negative electrodes, are provided at portions in proximity to four corners of the semiconductor light emitting element 10 and each of the n-electrode layers 140 includes a portion from which part of each of four n-electrode bonding layers 144 used for electrical connection with the outside is exposed (referred to as "N-distribution").

Moreover, the semiconductor light emitting element 10 has, at the center portion thereof, a portion from which a single p-electrode bonding layer 135, which is used for electrical connection between the p-electrode layer 130 as the positive electrode and the outside, is exposed. The p-electrode layer 130 is formed to cover substantially an entire top surface of the semiconductor layer 120 except for some portions in each of which part thereof has been removed by means of etching or the like for forming the n-electrode layers 140.

As described above, in the semiconductor light emitting element 10 to which the exemplary embodiment is applied, the plural n-electrode layers 140 are laminated on the n-type semiconductor layer 123 and are electrically connected to the n-type semiconductor layer 123, and as shown in the schematic plan view of FIG. 1, which views from lamination direction of these layers, arranged to enclose at least a partial region of the light emitting layer 124 and the p-type semiconductor layer 125. The number of n-electrode layers 140 is not particularly limited. In the exemplary embodiment, normally, the number is appropriately selected from a range of four to six. The arrangement of the plural n-electrode layers 140 is not particularly limited, too. In the exemplary embodiment, for example, as shown in FIG. 1, the four n-electrode layers 140 are respectively distributed at the four corners of the semiconductor light emitting element 10.

On the other hand, as will be described later, the p-electrode layer 130 includes an insulating reflection layer 132 that is laminated on the p-type semiconductor layer 125 and has a reflective property to the light outputted from the light emitting layer 124, and is electrically connected to the p-type semiconductor layer 125, and includes a portion in a region of the center portion surrounded by the plural n-electrode layers 140 as viewed from the lamination direction, where the p-electrode bonding layer 135 as a connecting portion used for electrical connection with the outside is exposed.

Moreover, in the insulating reflection layer 132 (refer to FIG. 3) of the p-electrode layer 130, plural opening portions 132h are formed. In FIG. 1, the opening portion 132h is represented as a circular blank portion (diameter=8 μm). FIG. 1 shows a pattern (referred to as "isolation pattern") in which the plural opening portions 132h are arranged on the entire insulating reflection layer 132 (refer to FIG. 2) with predetermined intervals (pitch 1) being provided mutually.

(P-Electrode Layer 130)

In the exemplary embodiment, in the p-electrode layer 130, a transparent conductive layer 131 composed of a metal oxide is laminated on the p-type semiconductor layer 125. Here, "transparent" means to have transparency to the light outputted from the light emitting layer 124. Further, on the transparent conductive layer 131, the insulating reflection layer 132, a first p-electrode adhesive layer 133a composed of a conducive metal oxide material, a metal reflection layer 133b configured with a metal containing Ag (silver), a p-electrode diffusion-preventing layer 134 (a first p-electrode diffusion-preventing layer 134a, a second p-electrode diffusion-preventing layer 134b and a third p-electrode diffusion-preventing layer 134c), the p-electrode bonding layer 135 and a second p-electrode adhesive layer 136 are laminated in order.

(Transparent Conductive Layer 131)

As a material for constituting the transparent conductive layer 131, a conductive metal oxide material that transmits at least 80% of the order of light of wavelength emitted from the light emitting layer 124 is used. For example, oxides containing In (indium) are provided. Examples include: ITO (indium tin oxide ($In_2O_3$—$SnO_2$)); IZO (indium zinc oxide ($In_2O_3$—ZnO)); IGO (indium gallium oxide ($In_2O_3$—$Ga_2O_3$)); and ICO (indium cerium oxide ($In_2O_3$—$CeO_2$)). Of these, in particular, a transparent material containing $In_2O_3$ crystals having a crystal structure of a hexagonal system or a bixbyite structure (for example, ITO or IZO) is preferable. Further, in the case where IZO containing $In_2O_3$ crystals having a crystal structure of a hexagonal system is used, an amorphous IZO film that has an excellent etching property can be used and processed into a specific shape, and thereafter, by transferring the amorphous state into a structure containing crystals through a heat treatment or the like, processed into an electrode that is more excellent in optical transparency than the amorphous IZO film.

In the exemplary embodiment, the thickness of the transparent conductive layer 131 is selected from a range of 10 nm to 300 nm. Or, the thickness is preferably selected from a range of 150 nm to 250 nm. In the case where the transparent conductive layer 131 is excessively thin or thick, there is an unfavorable tendency in terms of light transparency to the light emitted from the light emitting layer 124 and the reflected light from the metal reflection layer 133b.

The sheet resistance of the transparent conductive layer 131 is, though depending upon the manufacturing method thereof, infinite (∞) when the thickness is 10 nm, 250Ω per square when the thickness is 20 nm, 175Ω per square when the thickness is 25 nm, 72Ω per square when the thickness is 50 nm, 29Ω per square when the thickness is 100 nm, and 15Ω per square when the thickness is 200 nm.

(Insulating Reflection Layer 132)

The semiconductor light emitting element 10 to which the exemplary embodiment is applied is provided with the insulating reflection layer 132. The insulating reflection layer 132 is laminated on the transparent conductive layer 131, and together with the metal reflection layer 133b, which will be described later, has a function of a reflection film that reflects the light outputted from the light emitting layer 124. Further, the insulating reflection layer 132 has transparency of at least of the order of 90% and preferably 95% or more to the light outputted from the light emitting layer 124, a refractive index lower than that of the transparent conductive layer 131 and insulating properties. Examples of materials constituting the insulating reflection layer 132 include: $SiO_2$ (silicon dioxide); $MgF_2$ (magnesium fluoride); $CaF_2$ (calcium fluoride); and $Al_2O_3$ (aluminum oxide). In the exemplary embodiment, as the insulating reflection layer 132, $SiO_2$ (silicon dioxide) having a refractive index $n_1$ of 1.48 (wavelength of 450 nm) is used. It should be noted that the refractive index $n_2$ of an IZO film constituting the transparent conductive layer 131 is 2.14 (wavelength of 450 nm).

In the exemplary embodiment, the thickness (H) of the insulating reflection layer 132 is, in a relation with $Q = (\lambda/4n)$ defined by use of the refractive index n of the insulating reflection layer 132 and the wavelength $\lambda$ (nm) of the light emitting layer 124, set in a relation of formula (1) as shown below. As described above, Q indicates a result of dividing the wavelength $\lambda$ (nm) of the light emitting layer 124 by a four-fold refractive index n.

$$H = AQ \quad (1)$$

Further, it is preferable to set the thickness of the insulating reflection layer 132 based on the following formula (2). In other words, it is preferable to set the thickness to 5 Q (A=5) or more. However, under the constraint of production costs, the thickness is preferably 20 Q (A=20) or less.

$$H \geq 5Q \quad (2)$$

In the exemplary embodiment, it is preferable to set the thickness of the insulating reflection layer 132 in the range that A exceeds 5, namely, in the case of blue light of the wavelength of 450 nm, in the range of the thickness exceeding 380 nm. From experimental data of the inventors and simulation results, a conclusion that the light emission intensity is particularly increased with a thickness in which A is an odd number, such as A=3, 5, 7, ... is obtained, and a fact that the thickness in which A=3, 5, 7 and so forth is especially preferred and the output of the semiconductor light emitting element 10 depends upon the thickness of the insulating reflection layer 132 is ascertained. In the exemplary embodiment, it is especially preferable that the thickness of the insulating reflection layer 132 is in a range that A is an odd number such as 3, 5, 7, ... ±0.5 as a unit. More specifically, from the inventors' experiments, it is ascertained that the output of the semiconductor light emitting element 10 is increased as A is increased (the thickness of the insulating reflection layer 132 is increased), and further, the light emission intensity is especially and effectively increased with the thickness in which A=3, 5, 7 ....

Next, description will be given of an insulating reflection layer having a multilayer structure, which is an example of another layer structure.

Figure 3:
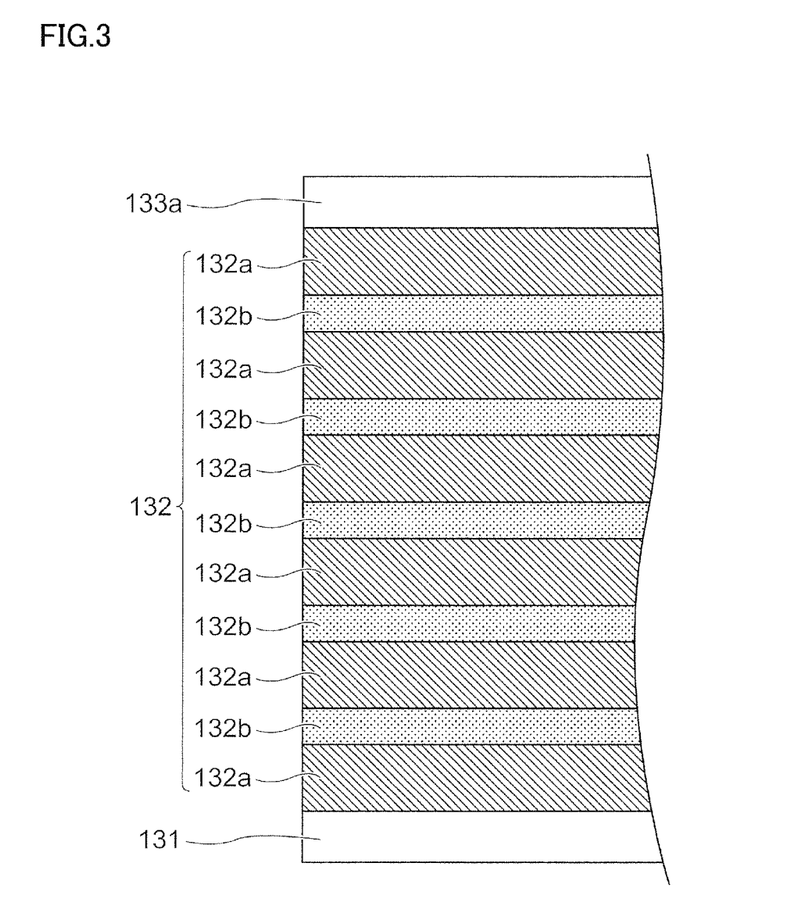
FIG. 3 is a schematic cross-sectional view illustrating an example of a layer structure of an insulating reflection layer.

FIG. 3 is a schematic cross-sectional view illustrating the example of a layer structure of the insulating reflection layer 132. In the exemplary embodiment, the insulating reflection layer 132 has a multilayer structure that is a laminated body of plural layers different in refractive index. The insulating reflection layer 132 having a multilayer structure is configured by alternately laminating first insulating reflection layers 132a having a first refractive index and second insulating reflection layers 132b having a second refractive index that is higher than the first refractive index. Especially, the exemplary embodiment employs a configuration in which one second insulating reflection layer 132b is sandwiched by two first insulating reflection layers 132a.

In the example shown in FIG. 3, five second insulating reflection layers 132b are sandwiched between six first insulating reflection layers 132a to provide eleven layers of laminated layer structure in total.

As the first insulating reflection layer 132a and the second insulating reflection layer 132b, a material having high optical transparent properties to the light emitted from the light emitting layer 124 is used. Here, as the first insulating reflection layer 132a, for example, $SiO_2$ (silicon dioxide) or $MgF_2$ (magnesium fluoride) can be used, and as the second insulating reflection layer 132b, $TiO_2$ (titanium oxide), $Ta_2O_5$ (tantalum oxide), $ZrO_2$ (zirconium oxide), $HfO_2$ (hafnium oxide) or $Nb_2O_5$ (niobium oxide) can be used. However, as long as relation in the refractive index with the second insulating reflection layer 132b is satisfied, these $TiO_2$, $Ta_2O_5$, $ZrO_2$, $HfO_2$ or $Nb_2O_5$ may be used as the first insulating reflection layer 132a.

In the exemplary embodiment, $SiO_2$ (silicon dioxide) is used as the first insulating reflection layer 132a, and $Ta_2O_5$ (tantalum oxide) having a refractive index of 2.21 (to light having wavelength of 450 nm) is used as the second insulating reflection layer 132b. These have high optical transparency to the light from the light emitting layer 124 with light emission wavelength λ (=400 nm to 450 nm).

Further, when it is assumed that the light emission wavelength of the light emitting layer 124 is λ (nm), the refractive index of the first insulating reflection layer 132a with respect to the light emission wavelength λ is $n_L$ and the refractive index of the second insulating reflection layer 132b with respect to the light emission wavelength λ is $n_H$, the thickness $d_L$ of each first insulating reflection layer 132a and the thickness $d_H$ of each second insulating reflection layer 132b are set based on the expressions shown as follows. In the exemplary embodiment, the thickness (H) of the insulating reflection layer 132 having a multilayer structure is 1000 nm to 1500 nm. R(1) and R(2) are positive real numbers.

[Expression 1]

$$d_L = \frac{\lambda}{4 \times n_L} \times R \quad (1)$$

$$d_H = \frac{\lambda}{4 \times n_H} \times R \quad (2)$$

(Opening Portion 132h)

In the insulating reflection layer 132, the plural opening portions 132h are provided to expose part of the transparent conductive layer 131 laminated on the p-type semiconductor layer 125. The opening portions 132h are formed to penetrate through the insulating reflection layer 132, and inside of each opening portion 132h, part of the first p-electrode adhesive layer 133a, and further, part of the metal reflection layer 133b laminated on the first p-electrode adhesive layer 133a are formed.

The diameter (φ1) of the opening portion 132h is, in the exemplary embodiment, selected from a range of 5 μm to 30 μm, and preferably selected from a range of 5 μm to 20 μm. In FIGS. 1 and 2, the diameter (φ1) of the opening portion 132h is 8 μm. The opening portion 132h is formed, for example, by a dry etching method, a lift-off method or the like in the insulating reflection layer 132 formed in advance.

The shape of the opening portion 132h in a planar view is not particularly limited, and the shape may be circular, oval, triangular, square, rectangular, trapezoidal, pentagonal or other polygonal one (including star shape), wedge shape or the like. The area of the opening portion 132h is not particularly limited, and further, the areas of respective plural opening portions 132h are same or different.

The plural opening portions 132h are provided at the predetermined intervals (pitch 1). In the exemplary embodiment, pitch 1 is selected from a range of 10 μm to 120 μm. Further, preferably, pitch 1 is selected from a range of 20 μm to 100 μm. In FIGS. 1 and 2, pitch 1 is 40 μm.

The ratio of the sum total of the area of the plural opening portions 132h (the diameter is φ1) to the entire area of the insulating reflection layer 132 (area occupancy rate) is selected from a range of 2% to 50%. Moreover, the area occupancy rate is preferably selected from a range of 2% to 7%. In FIGS. 2 and 3, the area occupancy rate is 5%.

In the exemplary embodiment, the plural opening portions 132h are formed in the insulating reflection layer 132 and a conductive body portion including part of the metal reflection layer 133b is formed in each opening portion 132h, to thereby uniformly pass a current over the entire surface of the p-type semiconductor layer 125 on the surface of the p-electrode layer 130 through the transparent conductive layer 131. This makes it possible to reduce light emission unevenness in the light emitting layer 124.

(First P-Electrode Adhesive Layer 133a)

In the exemplary embodiment, the first p-electrode adhesive layer 133a is formed to cover substantially an entire region on the insulating reflection layer 132 and portions where the transparent conductive layer 131 is exposed in the plural opening portions 132h. As a material for constituting the first p-electrode adhesive layer 133a, a material, which is a conductive material of a metal oxide similar to the material constituting the transparent conductive layer 131, that transmits at least 80% of the order of light of wavelength emitted from the light emitting layer 124 is used.

The first p-electrode adhesive layer 133a is provided to improve physical adhesive properties between the transparent conductive layer 131 and the metal reflection layer 133b. As a material for constituting the first p-electrode adhesive layer 133a, it is preferable to employ a material same as the material constituting the transparent conductive layer 131 because good adhesive properties become available. Moreover, as the conductive material of a metal oxide to constitute the first p-electrode adhesive layer 133a, it is preferable to use a material of an amorphous structure because good adhesive properties become available.

(Metal Reflection Layer 133b)

In the exemplary embodiment, the metal reflection layer 133b is formed to cover substantially an entire region on the first p-electrode adhesive layer 133a including the inside of the plural opening portions 132h in the insulating reflection layer 132. The material constituting the metal reflection layer 133b is a metal containing Ag (silver), and therefore, Ag or an Ag alloy containing at least one of metals such as Pd (palladium), Cu (cupper), Nd (neodymium), Al (aluminum), Ni (nickel) and Cr (chromium) is provided. Ag or Ag alloy is preferable in terms of having high reflective property to the light of wavelength of blue to green emitted from the light emitting layer 124. In a case where heat resistance or resistance to high temperature and humidity is required due to a use environment, the Ag alloy is preferably used.

In the exemplary embodiment, the thickness of the metal reflection layer 133b is selected from a range of 50 nm to 200 nm, or preferably selected from a range of 80 nm to 150 nm.

(P-Electrode Diffusion-Preventing Layer 134)

The p-electrode diffusion-preventing layer 134 suppresses diffusion of a metal constituting the metal reflection layer 133b into the p-electrode bonding layer 135. It is preferable to use each layer in the p-electrode diffusion-preventing layer 134 capable of making an ohmic contact with a layer to contact, and has a small contact resistance with the layer to contact. In the exemplary embodiment, in the p-electrode diffusion-preventing layer 134, Ta (tantalum) is used as the first p-electrode diffusion-preventing layer 134a, Ti (titanium) is used as the second p-electrode diffusion-preventing layer 134b, and Pt (platinum) is used as the third p-electrode diffusion-preventing layer 134c.

(P-Electrode Bonding Layer 135)

In the exemplary embodiment, Au (gold) is used as the p-electrode bonding layer 135.

(Second P-Electrode Adhesive Layer 136)

The second p-electrode adhesive layer 136 is provided to improve physical adhesive properties, for example, between the p-electrode bonding layer 135 composed of Au (gold) and protecting layer 150. In the exemplary embodiment, the second p-electrode adhesive layer 136 is formed by use of Ti (titanium). However, other than Ti, it is also possible to use, for example, Ta (tantalum) or Ni (nickel).

(N-Electrode Layer 140)

In the exemplary embodiment, in the n-electrode layer 140, a first n-electrode adhesive layer 141 containing Ti (titanium), a first conductive layer 142 containing the Al (aluminum)-Nd (neodymium) alloy, a second conductive layer 143a containing Ta (tantalum), a third conductive layer 143b containing Ti (titanium), a fourth conductive layer 143c containing Pt (platinum), the n-electrode bonding layer 144 containing Ag (gold) and a second n-electrode adhesive layer 145 containing Ti (titanium) are laminated in order from the n-type semiconductor layer 123 side.

It should be noted that, in the n-electrode layer 140, part of the protecting layer 150 and second n-electrode adhesive layer 145 is cutout by a known photolithographic technology, to thereby expose part of the n-electrode bonding layer 144.

Next, description will be given of materials of each of other layers constituting the semiconductor light emitting element 10.

(Substrate 110)

As the substrate 110, there is no particular limitation on any substrate as long as group III nitride semiconductor crystals are epitaxially grown on a surface thereof, and accordingly, various kinds of substrate may be selected and used. However, as will be described later, since the semiconductor light emitting element 10 of the exemplary embodiment is flip-chip mounted so that the light is extracted from the substrate 110 side, it is preferable to have transparency to the light emitted from the light emitting layer 124. Accordingly, the substrate 110 composed of, for example, sapphire, GaN, SiC, silicon or the like can be used. Among the above-described materials, it is preferable to use sapphire in which C-face is a principal surface as the substrate 110.

(Intermediate Layer 121)

The intermediate layer 121 is preferably composed of polycrystal $Al_xGa_{1-x}N$ ($0 \leq x \leq 1$), and more preferably, composed of single crystal $Al_xGa_{1-x}N$ ($0 \leq x \leq 1$). The intermediate layer 121 can be, for example, composed of polycrystal $Al_xGa_{1-x}N$ ($0 \leq x \leq 1$) with a thickness of 0.01 µm to 0.5 µm. If the thickness of the intermediate layer 121 is excessively thin, there are some cases where an effect of the intermediate layer 121 to mediate the difference in lattice constant between the substrate 110 and the base layer 122 cannot be sufficiently obtained. On the other hand, if the thickness of the intermediate layer 121 is excessively thick, there is a possibility that the time of forming process of the intermediate layer 121 becomes longer though there is no change to the function of the intermediate layer 121, and accordingly the productivity is decreased. The intermediate layer 121 has a function of mediating the difference in lattice constant between the substrate 110 and the base layer 122 to facilitate the formation of a single crystal layer which is C-axis oriented above the (0001) surface (C-face) of the substrate 110. Consequently, on the intermediate layer 121, the base layer 122 having more excellent crystallinity can be laminated.

Further, the intermediate layer 121 may have a crystal structure of a hexagonal system composed of the group III nitride semiconductor. Moreover, as the crystal of the group III nitride semiconductor constituting the intermediate layer 121, the crystal having a single crystal structure is preferably used. Crystals of the group III nitride semiconductor grow not only in an upper direction but also in an in-plane direction to form a single crystal structure by controlling growing conditions. Accordingly, the intermediate layer 121 can be composed of the group III nitride semiconductor crystals having single crystal structure by controlling layer forming conditions of the intermediate layer 121. In the case where the intermediate layer 121 having such a single crystal structure is formed on the substrate 110, the buffer function of the intermediate layer 121 effectively works, and thereby the group III nitride semiconductor formed thereon becomes a crystal film having excellent orientation property and crystallinity.

(Base Layer 122)

As the base layer 122, $Al_xGa_yIn_zN$ ($0 \leq x \leq 1$, $0 \leq y \leq 1$, $0 \leq z \leq 1$, $x+y+z=1$) can be used, but it is preferable to use $Al_xGa_{1-x}N$ ($0 \leq x < 1$) because the base layer 122 with excellent crystallinity can be formed.

The thickness of the base layer 122 is preferably 0.1 µm or more, more preferably 0.5 µm or more, and most preferably 1 µm or more. The $Al_xGa_{1-x}N$ layer having excellent crystallinity is likely to be obtained with these layer thickness or more. Further, in terms of production cost, the thickness of the base layer 122 is preferably 15 µm or less, and more preferably 10 µm or less.

To improve the crystallinity of the base layer 122, it is desirable that the base layer 122 is not doped with impurities. However, if conductivity of p-type or n-type is needed, acceptor impurities or donor impurities can be added.

(Laminated Semiconductor Layer 126)

Figure 4:
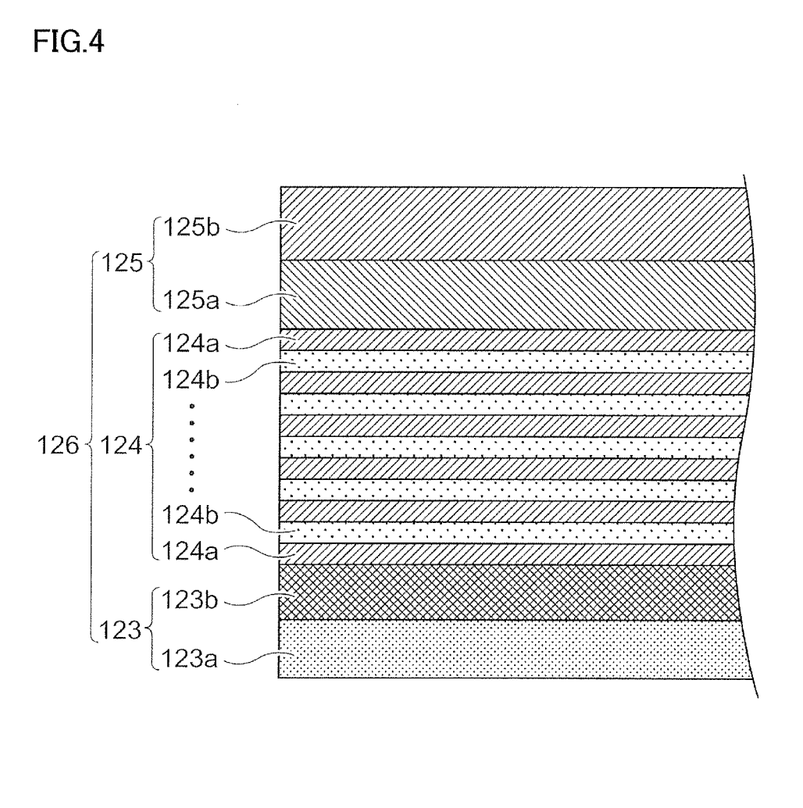
FIG. 4 is a schematic cross-sectional view illustrating an example of a laminated semiconductor layer.

FIG. 4 is a schematic cross-sectional view illustrating an example of the laminated semiconductor layer 126. The laminated semiconductor layer 126 is composed of, for example, a group III nitride semiconductor, which is configured by laminating the n-type semiconductor layer 123, the light emitting layer 124 and the p-type semiconductor layer 125 above the substrate 110 in this order. In the exemplary embodiment, each layer of the laminated semiconductor layer 126 is configured by plural semiconductor layers. It should be noted that the laminated semiconductor layer 126 is assumed to further include the base layer 122 and the intermediate layer 121 in some cases. Here, the n-type semiconductor layer 123 performs electrical conduction in which an electron is a carrier, while the p-type semiconductor layer 125 performs electrical conduction in which a hole is a carrier. It should be noted that the laminated semiconductor layer 126 with excellent crystallinity can be obtained by an MOCVD method; however, a sputtering method under optimized conditions can form the laminated semiconductor layer 126 having more excellent crystallinity than that formed by the MOCVD method.

(N-Type Semiconductor Layer 123)

As shown in FIG. 4, the n-type semiconductor layer 123, in which an electron is a carrier, is preferably configured with an n-contact layer 123a and an n-cladding layer 123b. It should be noted that the n-contact layer 123a can also serve as the n-cladding layer 123b. Further, the above-described base layer 122 may be included in the n-type semiconductor layer 123.

The n-contact layer 123a is a layer for providing the n-electrode layer 140. The n-contact layer 123a is preferably configured with the $Al_xGa_{1-x}N$ layer ($0 \leq x < 1$, preferably $0 \leq x \leq 0.5$, and more preferably $0 \leq x \leq 0.1$).

Further, the n-contact layer 123a is preferably doped with n-type impurities, and preferably contains the n-type impurities having a density of $1\times10^{17}/cm^3$ to $1\times10^{20}/cm^3$, and preferably a density of $1\times10^{18}/cm^3$ to $1\times10^{19}/cm^3$ on the point that a good ohmic contact with the n-electrode layer 140 can be maintained. The n-type impurities are not particularly limited, however, Si, Ge, Sn and so on are provided, and Si and Ge are preferably provided.

The thickness of the n-contact layer 123a is preferably set to 0.5 μm to 5 μm, and more preferably set in a range of 1 μm to 3 μm. If the thickness of the n-contact layer 123a is in the above-described ranges, crystallinity of the semiconductor is suitably maintained.

It is preferable to provide the n-cladding layer 123b between the n-contact layer 123a and the light emitting layer 124. The n-cladding layer 123b performs injection of the carriers into the light emitting layer 124 and confinement of the carriers. The n-cladding layer 123b can be formed of AlGaN, GaN, GaInN and so on. It should be noted that, in this specification, materials are referred to as, for example, AlGaN or GaInN with the compositional ratio of each element omitted. Further, the hetero junction structure or the superlattice structure in which the layer is laminated plural times of these structures may also be used. When the n-cladding layer 123b is formed of GaInN, the band gap thereof is preferably larger than that of GaInN of the light emitting layer 124.

The thickness of the n-cladding layer 123b is not particularly limited, but preferably in a range of 0.005 μm to 0.5 μm, and more preferably in a range of 0.005 μm to 0.1 μm. The n-type doping concentration of the n-cladding layer 123b is preferably in a range of $1\times10^{17}/cm^3$ to $1\times10^{20}/cm^3$, and more preferably in a range of $1\times10^{18}/cm^3$ to $1\times10^{19}/cm^3$. It is preferable to provide the doping concentration in these ranges in terms of maintaining excellent crystallinity and reducing operation voltage of the light emitting element.

It should be noted that, in the case where the n-cladding layer 123b is a layer containing the superlattice structure, the layer may contain a structure in which an n-side first layer composed of the group III nitride semiconductor with a thickness of 100 angstrom or less and an n-side second layer having a different composition from the n-side first layer and composed of the group III nitride semiconductor with a thickness of 100 angstrom or less are laminated, though detailed illustration is omitted. Further, the n-cladding layer 123b may contain a structure in which the n-side first layers and the n-side second layers are alternately and repeatedly laminated, and the structure is preferably an alternating structure of GaInN and GaN or an alternating structure of GaInN having different compositions.

(Light Emitting Layer 124)

As the light emitting layer 124 laminated on the n-type semiconductor layer 123, a single quantum well structure or a multiple quantum well structure can be employed. As a well layer 124b having a quantum well structure, the group III nitride semiconductor layer composed of $Ga_{1-y}In_yN$ (0<y<0.4) is usually used. The thickness of the well layer 124b may be the thickness by which quantum effects can be obtained, for example, 1 nm to 10 nm, and preferably 2 nm to 6 nm in terms of light emission output.

Moreover, in the case of the light emitting layer 124 having the multiple quantum well structure, the above-described $Ga_{1-y}In_yN$ is employed as the well layer 124b, and $Al_zGa_{1-z}N$ (0≤z<0.3) having a band gap energy larger than that of the well layer 124b is employed as a barrier layer 124a. The well layer 124b and the barrier layer 124a may be doped or not doped with impurities depending upon a design thereof. It should be noted that, in the exemplary embodiment, the light emitting layer 124 is configured to output blue light (light emission wavelength of the order of λ=400 nm to 465 nm).

(P-Type Semiconductor Layer 125)

The p-type semiconductor layer 125, in which a hole is a carrier, is usually configured with the p-cladding layer 125a and the p-contact layer 125b. Further, the p-contact layer 125b can also serve as the p-cladding layer 125a.

The p-cladding layer 125a performs confinement of carriers within the light emitting layer 124 and injection of carriers. The p-cladding layer 125a is not particularly limited as long as the band gap energy of the composition thereof is larger than that of the light emitting layer 124 and carriers can be confined within the light emitting layer 124, but is preferably composed of $Al_xGa_{1-x}N$ (0<x≤0.4).

It is preferable that the p-cladding layer 125a is composed of such AlGaN in terms of confinement of carriers within the light emitting layer 124. The thickness of the p-cladding layer 125a is not particularly limited, but preferably 1 nm to 400 nm, and more preferably 5 nm to 100 nm.

The p-type doping concentration of the p-cladding layer 125a is preferably $1\times10^{18}/cm^3$ to $1\times10^{21}/cm^3$, and more preferably $1\times10^{19}/cm^3$ to $1\times10^{20}/cm^3$. If the p-type doping concentration is in the above ranges, excellent p-type crystals can be obtained without deteriorating crystallinity.

Further, the p-cladding layer 125a may have a superlattice structure in which the layer is laminated plural times of these structures, and preferably has an alternating structure of AlGaN and AlGaN or an alternating structure of AlGaN and GaN.

The p-contact layer 125b is a layer for providing the p-electrode layer 130. The p-contact layer 125b is preferably composed of $Al_xGa_xN$ (0≤x≤0.4). It is preferable that Al composition is in the above-described range in terms of allowing to maintain excellent crystallinity and good ohmic contact with the p-electrode layer 130. It is preferable to contain p-type impurities (dopants) in a concentration of $1\times10^{18}/cm^3$ to $1\times10^{21}/cm^3$, and preferably $5\times10^{19}/cm^3$ to $5\times10^{20}/cm^3$ in terms of maintaining good ohmic contact, preventing cracking and maintaining excellent crystallinity. The p-type impurities are not particularly limited, but, for example, Mg is preferably provided. The thickness of the p-contact layer 125b is not particularly limited, but is preferably 10 nm to 500 nm, and more preferably 50 nm to 200 nm. It is preferable to provide the thickness of the p-contact layer 125b in these ranges in terms of light emission output.

(Protecting Layer 150)

The protecting layer 150 is formed of silicon oxide such as $SiO_2$. The thickness of the protecting layer 150 is usually provided in a range of 50 nm to 1 μm. If the thickness of the protecting layer 150 is excessively thin, there is a possibility of losing the function as the protecting layer, and besides, there is a tendency that the light emission output is reduced in a short period of time depending upon a use environment. Further, if the thickness of the protecting layer 150 is excessively thick, it is not preferable because productivity is decreased. It should be noted that, in the p-electrode layer 130 of the semiconductor light emitting element 10, part of the protecting layer 150 and p-electrode adhesive layer 136 is cutout by a known photolithographic technology, to thereby expose part of the p-electrode bonding layer 135.

Of the light emitted from the light emitting layer 124 (refer to FIG. 2) of the semiconductor light emitting element 10, light traveling toward the substrate 110 is extracted to the outside. On the other hand, of the light emitted from the light emitting layer 124, light traveling toward the p-electrode layer 130 is reflected by the insulating reflection layer 132 and the metal reflection layer 133*b* provided on the p-electrode layer 130 and proceeds toward the substrate 110, and is extracted to the outside.

Next, other exemplary embodiments of the semiconductor light emitting element 10 will be described.

Figure 5A:
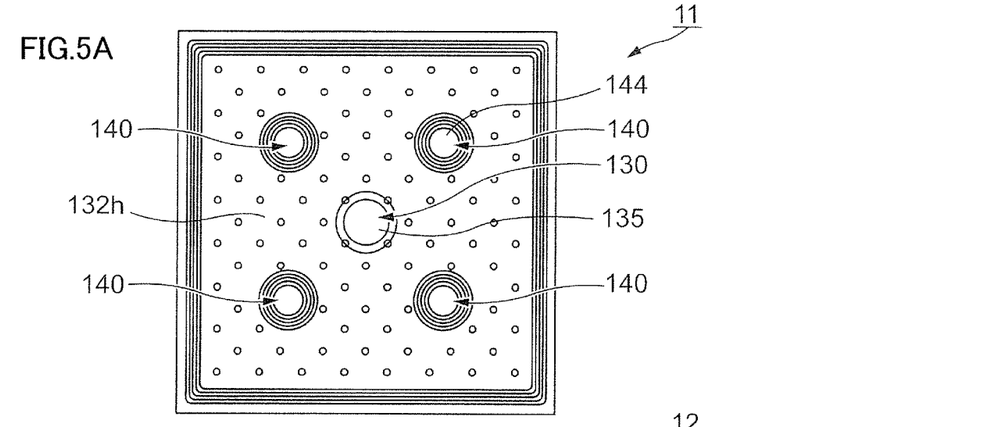
FIGS. 5A to 5C are schematic plan views illustrating arrangement examples of n-side electrodes.
Figure 5B:
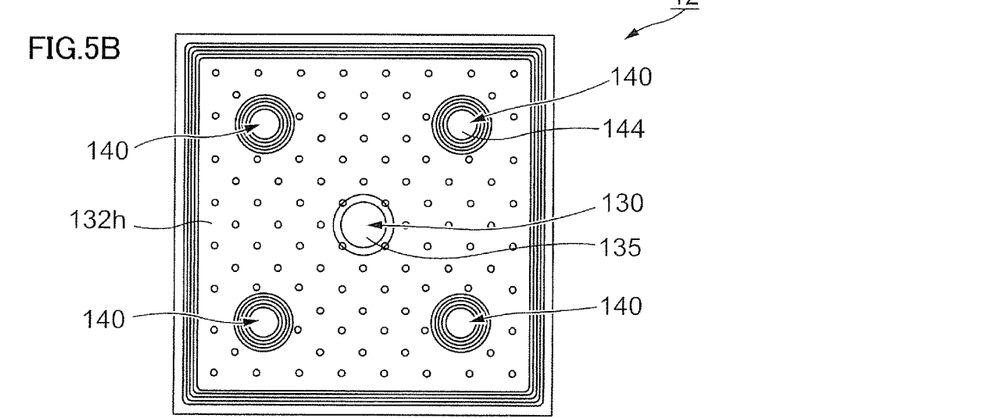
Figure 5C:
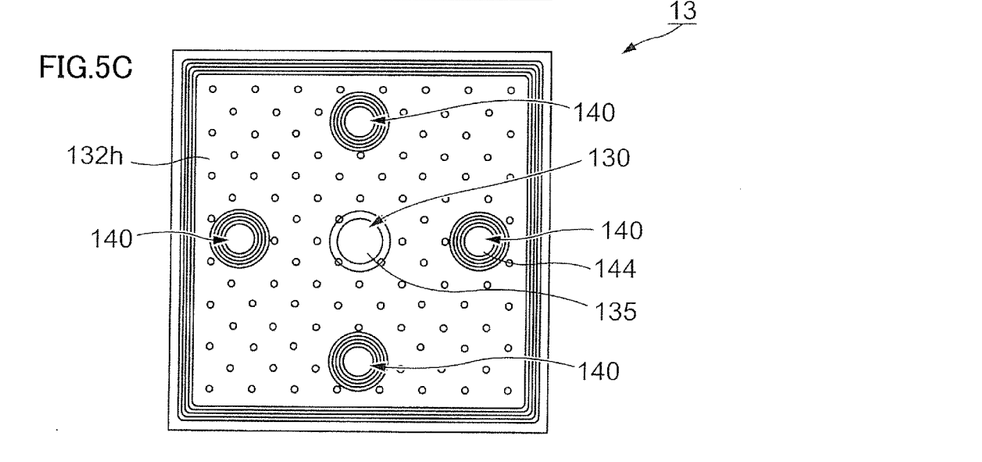

FIGS. 5A to 5C are schematic plan views illustrating arrangement examples of the n-side electrodes. For configurations similar to those in FIGS. 1 and 2, same symbols are used and detailed descriptions thereof are omitted.

FIG. 5A shows a first arrangement example of the four n-electrode layers 140. In a semiconductor light emitting element 11 shown in FIG. 5A, at the center portion thereof, part of a single p-electrode bonding layer 135, which is used for electrical connection between the p-electrode layer 130 as the positive electrode and the outside, is arranged to be exposed.

On two diagonal lines crossing each other while passing through the part of the p-electrode bonding layer 135 exposed at the enter portion, each of which connects a pair of opposing corners of the semiconductor light emitting element 11, each of the n-electrode layers 140, which are the negative electrodes, is arranged at a predetermined interval so that the part of the single p-electrode bonding layer 135 exposed at the surface is interposed between the parts of the two n-electrode bonding layers 144 exposed at the surface.

In this manner, in the case of the semiconductor light emitting element 11, a connecting portion of the single p-side electrode (part of the p-electrode bonding layer 135) is arranged in a region surrounded by the four n-side electrodes.

It should be noted that, in the case of the semiconductor light emitting element 11, the n-electrode layers 140 are arranged so that an interval between the part of the n-electrode bonding layer 144 and the part of the p-electrode bonding layer 135, which are exposed at the surface, becomes substantially equal to an interval between the corner of the semiconductor light emitting element 11 and the part of the n-electrode bonding layer 144.

FIG. 5B shows a second arrangement example of the four n-electrode layers 140. In a semiconductor light emitting element 12 shown in FIG. 5B, similar to the semiconductor light emitting element 11 shown in FIG. 5A, a connecting portion of a single p-side electrode is arranged at a region surrounded by four n-side electrodes.

That is, the p-electrode layer 130 is arranged so that part of the single p-electrode bonding layer 135 is exposed at the center portion. On two diagonal lines of the semiconductor light emitting element 12, each of the n-electrode layers 140 are arranged at a predetermined interval so that the part of the single p-electrode bonding layer 135 exposed at the surface is interposed between the parts of the two n-electrode bonding layers 144 exposed at the surface.

It should be noted that, in the case of the semiconductor light emitting element 12, the n-electrode layers 140 are arranged so that an interval between the part of the n-electrode bonding layer 144 and the part of the p-electrode bonding layer 135, which are exposed at the surface, on the single diagonal line becomes longer than an interval between the corner of the semiconductor light emitting element 12 and the part of the n-electrode bonding layer 144. It should be noted that the arrangement of the four n-electrode layers 140 of the semiconductor light emitting element 10 is same as that of the semiconductor light emitting element 12.

FIG. 5C shows a third arrangement example of the four n-electrode layers 140. In a semiconductor light emitting element 13 shown in FIG. 5, the p-electrode layer 130 is arranged so that part of the single p-electrode bonding layer 135 is exposed at the center portion.

On two straight lines intersecting each other at right angles while each passing through a middle point of each of a pair of opposing sides of the semiconductor light emitting element 13 and the part of the p-electrode bonding layer 135 exposed at the center portion, each of the n-electrode layers 140, which are the negative electrodes, is arranged at a predetermined interval so that the part of the single p-electrode bonding layer 135 exposed at the surface is interposed between the parts of the two n-electrode bonding layers 144 exposed at the surface.

It should be noted that, in the case of the semiconductor light emitting element 13, the parts of the two n-electrode bonding layers 144 and the part of the single p-electrode bonding layer 135 provided to be exposed on a single straight line are arranged so that the interval between the part of the n-electrode bonding layer 144 and the part of the p-electrode bonding layer 135 exposed at the surface is about twice as long as the interval between one side of the semiconductor light emitting element 13 and the n-side electrode.

Figure 6A:
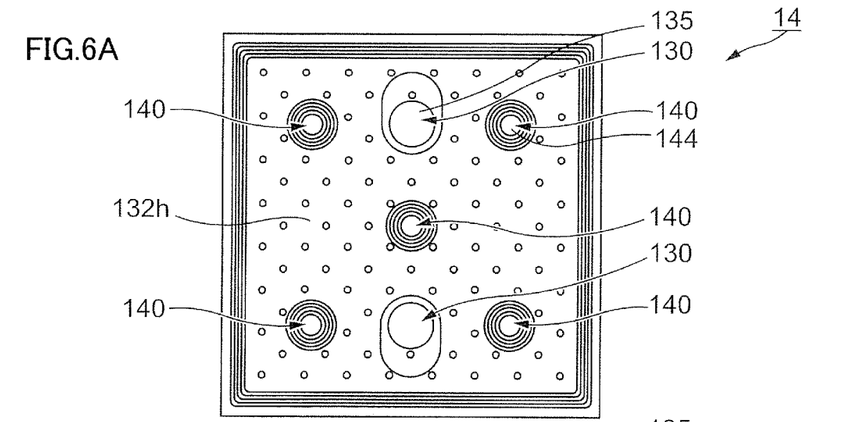
FIGS. 6A to 6C are schematic plan views illustrating other arrangement examples of the n-side electrodes.
Figure 6B:
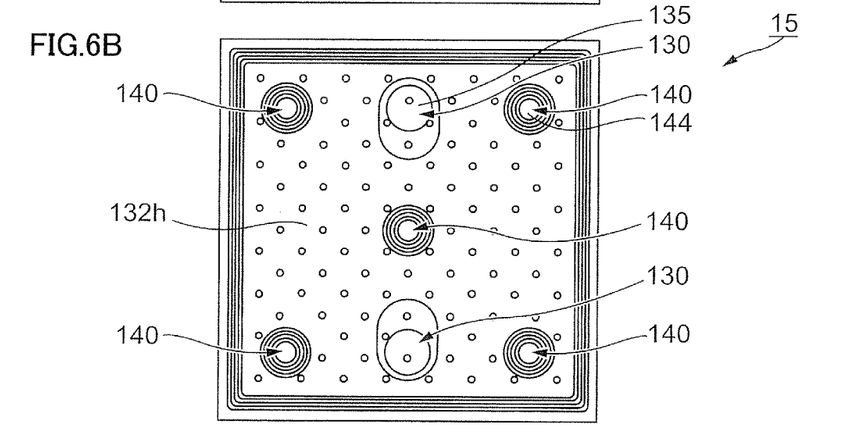
Figure 6C:
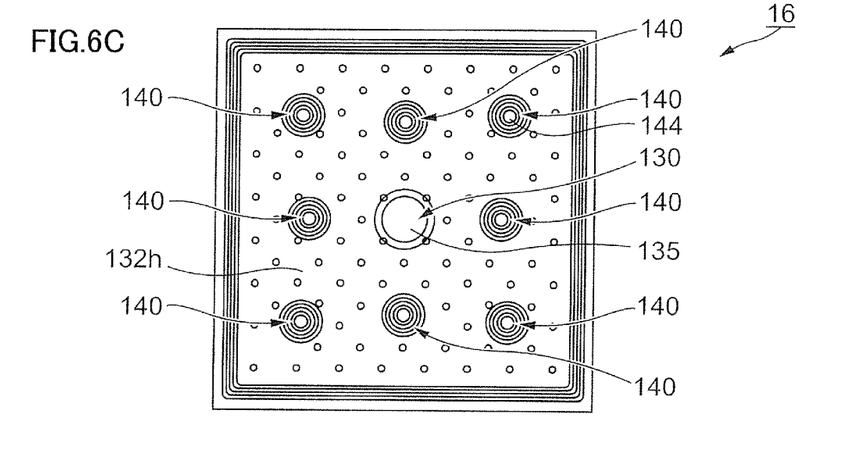

FIGS. 6A to 6C are schematic plan views that illustrate other arrangement examples of the n-side electrodes. For configurations similar to those in FIGS. 1 and 2, same symbols are used and detailed descriptions thereof are omitted.

FIG. 6A shows a first arrangement example of five n-electrode layers 140. In a semiconductor light emitting element 14 shown in FIG. 6A, on two diagonal lines crossing each other at a center portion, each of which connects a pair of opposing corners of the semiconductor light emitting element 14, the n-electrode layers 140, which are the negative electrodes, are arranged so that parts of the n-electrode bonding layers 144, in total five, are exposed at predetermined intervals to expose parts of three n-electrode bonding layers 144 that share the center portion where the diagonal lines cross each other.

On the other hand, on a straight line passing through middle points of a pair of opposing sides of the semiconductor light emitting element 14, the p-electrode layers 130, which are positive electrodes, are arranged at predetermined intervals so that parts of the two p-electrode bonding layers 135 of the p-electrode layers 130 as the positive electrodes are exposed with part of the single n-electrode bonding layer 144 arranged to be exposed at the center portion to be interposed therebetween.

In the case of the semiconductor light emitting element 14, parts of the two p-electrode bonding layers 135 are exposed so that the figure becomes vertically symmetric with respect to another straight line, as a center axis, that intersects at right angle with a straight line that passes through the middle points of a pair of opposing sides of the semiconductor light emitting element 14, on which part of the single n-electrode bonding layer 144 and parts of the two p-electrode bonding layers 135 are arranged. Accordingly, in the case of the semiconductor light emitting element 14, in each region surrounded by the three n-side electrodes, a connecting portion of the single p-side electrode (part of the p-electrode bonding layer 135) is arranged.

It should be noted that, in the case of the semiconductor light emitting element 14, with regard to the intervals between the parts of the n-electrode bonding layers 144 and the parts of the p-electrode bonding layers 135 that are exposed at the surface, these parts are arranged so that the interval between the n-electrode bonding layer 144 arranged at the center portion and the n-electrode bonding layer 144 arranged closer to the corner is longer than the interval between the n-electrode bonding layer 144 arranged closer to the corner on the diagonal line and the corner.

FIG. 6B shows a second arrangement example of the five n-electrode layers 140. In a semiconductor light emitting element 15 shown in FIG. 6B, similar to the semiconductor light emitting element 14 shown in FIG. 6A, on the two diagonal lines of the semiconductor light emitting element 15, the n-electrode layers 140, which are the negative electrodes, are arranged so that the parts of the n-electrode bonding layers 144, in total five, are exposed at predetermined intervals. On the other hand, the p-electrode layers 130, which are the positive electrodes, are arranged so that the parts of the two p-electrode bonding layers 135 are exposed with the part of the single n-electrode bonding layer 144 arranged at the center portion to be interposed therebetween.

In the case of the semiconductor light emitting element 15, the interval between the n-electrode bonding layer 144 arranged closer to the corner on the diagonal line and the corner is set shorter than that in the case of the semiconductor light emitting element 14 shown in FIG. 6A, to thereby arrange the n-electrode layer 140 further closer to the corner.

FIG. 6C shows an arrangement example of eight n-electrode layers 140. In a semiconductor light emitting element 16 shown in FIG. 6C, part of the single p-electrode bonding layer 135 used for electrical connection between the p-electrode layer 130, which is the positive electrode, and the outside is arranged to be exposed. With regard to the n-electrode layers 140, which are the negative electrodes, the parts of the n-electrode bonding layers 144, in total eight, that are exposed at the surface are arranged in a lattice pattern on the surface of the semiconductor light emitting element 16 to surround the part of the single p-electrode bonding layer 135 exposed at the center portion.

Next, description will be given of light emission properties of the semiconductor light emitting element to which the exemplary embodiments are applied.

FIGS. 7A to 7G show measurement results of light emission patterns (light emission intensity distributions) of the semiconductor light emitting element.

Figure 7A:
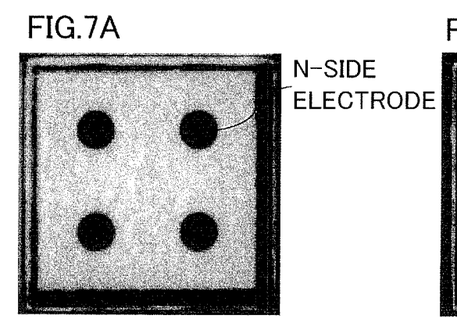
FIGS. 7A to 7G are light emission pattern measurement results of the semiconductor light emitting element.

FIG. 7A shows a light emission pattern of the arrangement example (the semiconductor light emitting element 11) shown in FIG. 5A. In the figure, a white portion indicates high light emission intensity and a black portion indicates low light emission intensity, to thereby represent the distribution of light emission intensity by shades of black and white. In the case of the arrangement example of FIG. 5A, it can be learned that the semiconductor light emitting element 11 including the center portion surrounded by the four n-side electrodes uniformly emits light in its near-entirety.

Figure 7B:
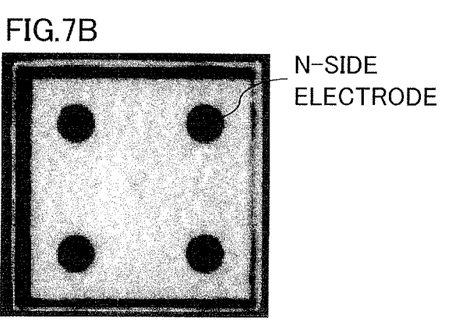

FIG. 7B shows a light emission pattern of the arrangement example (the semiconductor light emitting element 12) shown in FIG. 5B. In the case of the arrangement example of FIG. 5B, also, similar to the arrangement example of FIG. 5A, it is learned that the semiconductor light emitting element 12 including the center portion uniformly emits light in its near-entirety. The semiconductor light emitting element 10 had the similar result.

Figure 7C:
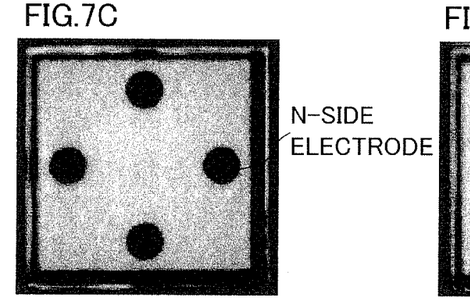

FIG. 7C shows a light emission pattern of the arrangement example (the semiconductor light emitting element 13) shown in FIG. 5C. In the case of the arrangement example of FIG. 5C, also, it can be learned that the semiconductor light emitting element 13 including the center portion uniformly emits light in its near-entirety.

Figure 7D:
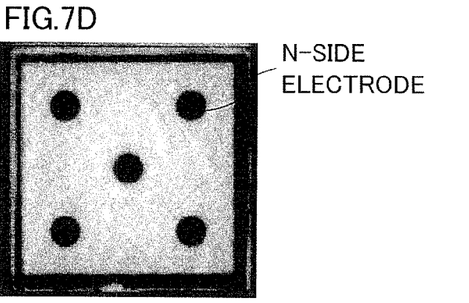

FIG. 7D shows a light emission pattern of the arrangement example (the semiconductor light emitting element 14) shown in FIG. 6A. In the case of the arrangement example of FIG. 6A, also, it can be learned that the semiconductor light emitting element 14 uniformly emits light in its near-entirety.

Figure 7E:
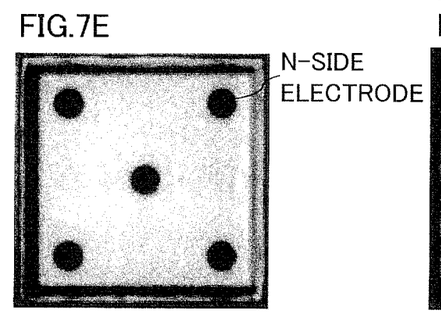

FIG. 7E shows a light emission pattern of the arrangement example (the semiconductor light emitting element 15) shown in FIG. 6B. In the case of the arrangement example of FIG. 6B, also, it can be learned that the semiconductor light emitting element 15 uniformly emits light in its near-entirety.

Figure 7F:
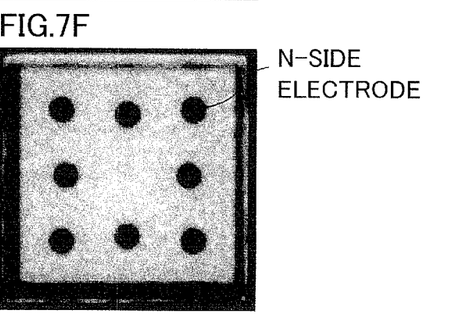

FIG. 7F shows a light emission pattern of the arrangement example (the semiconductor light emitting element 16) shown in FIG. 6C. In the case of the arrangement example of FIG. 6C, it can be learned that the semiconductor light emitting element 16 uniformly emits light in its near-entirety at inside and outside regions of arrangement of the n-side electrodes, in total eight.

As shown in FIGS. 7A to 7F, it can be learned that, according to the semiconductor light emitting element to which the exemplary embodiments are applied, the chip emits light in its entirety, and thereby the problem of light emission concentrated to the center portion is solved.

Figure 7G:
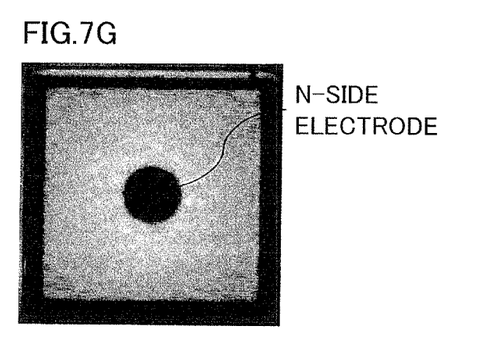

In contrast thereto, FIG. 7G is a reference example showing a light emission pattern in a case where a single n-side electrode is arranged at the center portion. In this case, though not shown, four p-side electrodes are arranged at four corners of a chip, respectively. As shown in FIG. 7G, it can be learned that, if the n-side electrode is provided at the center portion of the chip and the p-side electrodes are respectively provided at the four corners of the chip, light emission concentrates at the center portion of the chip, and therefore, the surface of the chip does not emit light uniformly.

Figure 8:
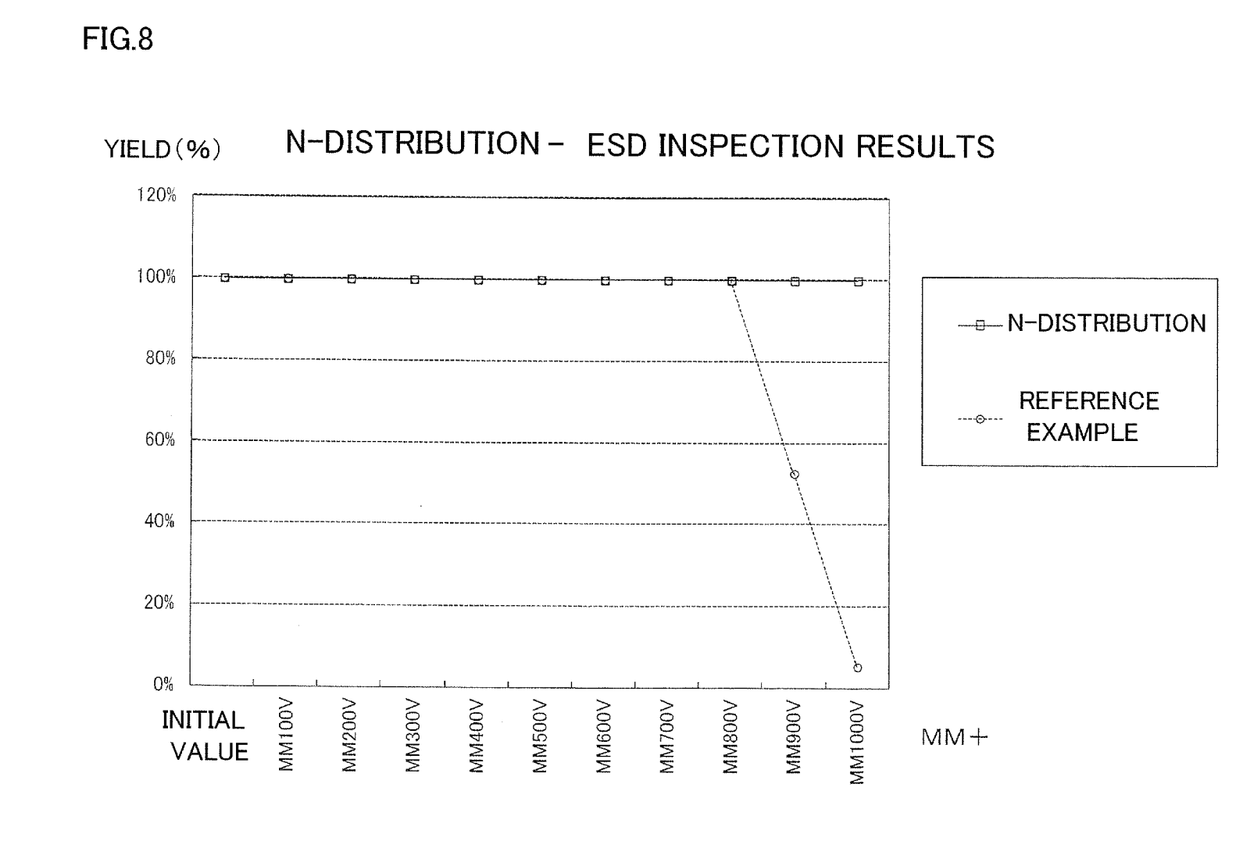
FIG. 8 is a graph showing ESD inspection results of the semiconductor light emitting element.

FIG. 8 is a graph showing ESD inspection results of the semiconductor light emitting element. The horizontal axis indicates an applied voltage (MM+: MM 100V to MM 1000V) in a machine model (MM) method. The vertical axis indicates a recovered rate (yield: %) that means a rate of recovering the semiconductor light emitting elements in the ESD inspection of the semiconductor light emitting elements without being damaged. In the ESD inspection, a case where all of the semiconductor light emitting elements are damaged is represented as 0%, whereas a case where all of the semiconductor light emitting elements can be recovered is represented as 100%. The ESD inspection was performed on the semiconductor light emitting element 10 in which the four n-side electrodes were arranged to be distributed to the four corners of the chip (N-distribution) and the semiconductor light emitting element of the reference example whose light emission pattern was shown in FIG. 7G (reference example).

As shown by the graph in FIG. 8, it can be learned that, in the semiconductor light emitting element 10 to which the exemplary embodiment is applied (N-distribution), all of the semiconductor light emitting elements can be recovered without being damaged (yield: 100%), and accordingly, the semiconductor light emitting elements have good resistance to the ESD.

In contrast thereto, in the case of the semiconductor light emitting element in which the single n-side electrode is arranged at the center portion (reference example), it can be learned that damage caused by the ESD develops when a voltage (MM+) exceeds MM 800V, and the recovering rate (yield) is reduced to 20% or less at MM 1000V.

Figure 9:
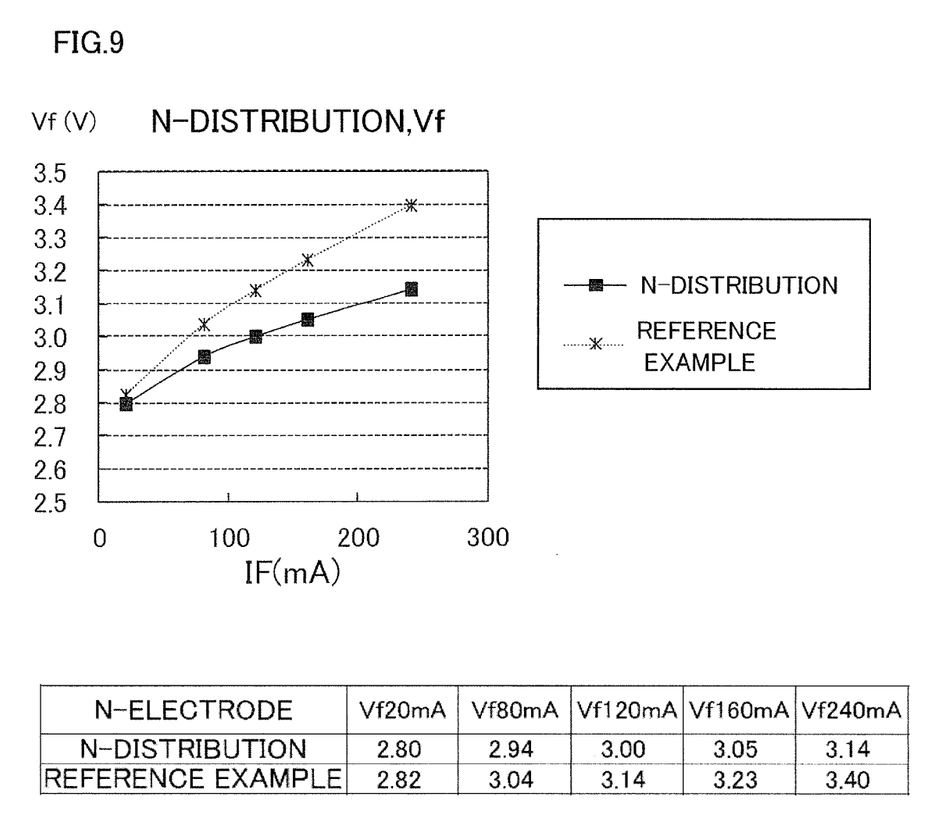
FIG. 9 is a graph showing Vf measurement results of the semiconductor light emitting element.

FIG. 9 is a graph showing Vf measurement results of the semiconductor light emitting element 10 (N-distribution, Vf). The horizontal axis indicates a forward current IF (unit: mA). The vertical axis indicates a forward voltage Vf (unit: V). In FIG. 9, "N-distribution" refers to the semiconductor light emitting element 10 in which the four n-side electrodes are arranged to be distributed in the four corners of the chip. "Reference example" refers to the semiconductor light emitting element in which the single n-side electrode is arranged at the center portion.

As shown by the graph in FIG. 9, it can be learned that, in the semiconductor light emitting element 10 to which the exemplary embodiment is applied (N-distribution), the forward voltage Vf (unit: V) is lower than that in the semiconductor light emitting element in which the single n-side electrode is arranged at the center portion (reference example), and accordingly, light emission performance and light emission efficiency thereof are excellent.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The exemplary embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A semiconductor light emitting element comprising:
   a laminated semiconductor layer in which an n-type semiconductor layer, a light emitting layer and a p-type semiconductor layer are laminated;
   a plurality of n-side electrodes that are laminated on the n-type semiconductor layer, electrically connected to the n-type semiconductor layer and arranged to surround at least a partial region of the light emitting layer and the p-type semiconductor layer as viewed from a lamination direction; and
   a p-side electrode that is provided on the p-type semiconductor layer, provided with a reflective property to light outputted from the light emitting layer and electrically connected to the p-type semiconductor layer, the p-side electrode comprising:
   a connecting portion, that is used for external electrical connection, that is disposed at a central region of the semiconductor light emitting element, and that is surrounded by the plurality of n-side electrodes disposed at four corner portions of the light emitting element, as viewed from the lamination direction;
   a transparent conductive layer that has transparency to the light output from the light emitting layer and a structure containing crystals, and that is laminated on the p-type semiconductor layer;
   an insulating reflection layer that is laminated on the transparent conductive layer and provided with a plurality of opening portions penetrating through the insulating reflection layer;
   an adhesive layer that is laminated on the insulating reflection layer, that is made of a material same as the transparent conductive layer, and that has an amorphous structure, a part of the adhesive layer being laminated on a part of the transparent conductive layer in the plurality of opening portions; and
   a metal reflection layer that is formed on the adhesive layer, a part of the metal reflection layer being laminated on the adhesive layer in the plurality of opening portions,
   wherein the plurality of n-side electrodes directly contacts the n-type semiconductor layer without the insulating reflection layer disposed therebetween.

2. The semiconductor light emitting element according to claim 1, wherein the insulating reflection layer comprises a multilayer insulating layer configured by alternately laminating a first insulating layer having a first refractive index and showing optical transparency to the light outputted from the light emitting layer and a second insulating layer having a second refractive index that is higher than the first refractive index and showing optical transparency to the light outputted from the light emitting layer.

* * * * *